(12) United States Patent
Bruno

(10) Patent No.: US 7,212,930 B2
(45) Date of Patent: May 1, 2007

(54) METHOD AND APPARATUS FOR PHASE DETERMINATION

(75) Inventor: David A. Bruno, Portland, OR (US)

(73) Assignee: Veris Industries, LLC, Portland, OR (US)

( * ) Notice: Subject to any disclaimer, the term of this patent is extended or adjusted under 35 U.S.C. 154(b) by 0 days.

(21) Appl. No.: 10/970,580

(22) Filed: Oct. 20, 2004

(65) Prior Publication Data

US 2006/0069522 A1   Mar. 30, 2006

Related U.S. Application Data

(60) Provisional application No. 60/613,752, filed on Sep. 27, 2004.

(51) Int. Cl.
  *G06F 19/00* (2006.01)
(52) U.S. Cl. .................. 702/60; 702/66; 702/187; 702/72; 324/76.11; 324/76.13

(58) Field of Classification Search ................ 702/60, 702/66, 71–79, 91, 187, 83, 61; 324/121 R, 324/76.12–76.13, 94, 97
See application file for complete search history.

(56) References Cited

U.S. PATENT DOCUMENTS

| | | | | |
|---|---|---|---|---|
| 6,269,317 | B1 * | 7/2001 | Schachner et al. | ............ 702/91 |
| 6,549,859 | B1 * | 4/2003 | Ward | ............ 702/66 |

\* cited by examiner

*Primary Examiner*—John E. Barlow, Jr.
*Assistant Examiner*—Hien Vo
(74) *Attorney, Agent, or Firm*—Chernoff, Vilhauer, McClung & Stenzel

(57) ABSTRACT

An electricity metering method and apparatus is provided for determining the phase of first waveform relative to a harmonically distorted, second waveform having cycles temporally distinguished by an occurrence of an amplitude that is neither zero amplitude nor a maximum amplitude of said waveform.

10 Claims, 4 Drawing Sheets

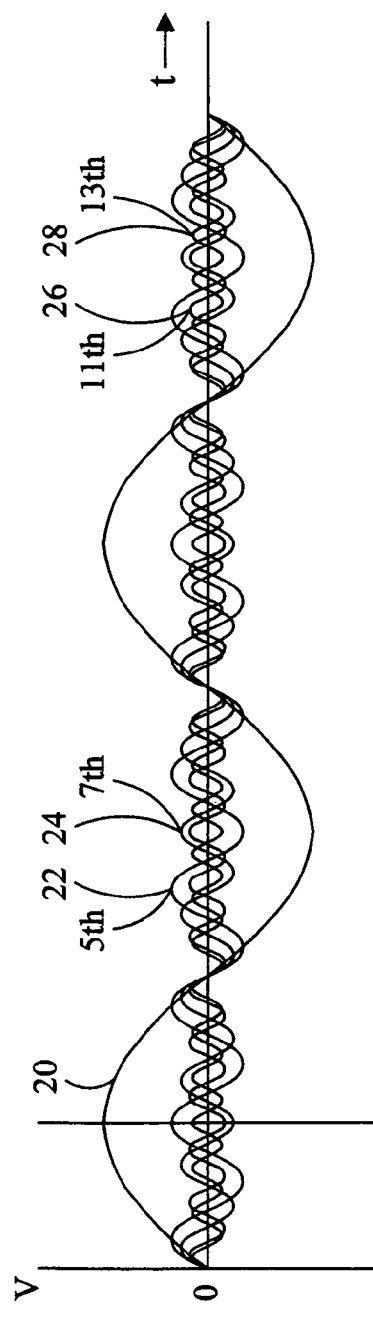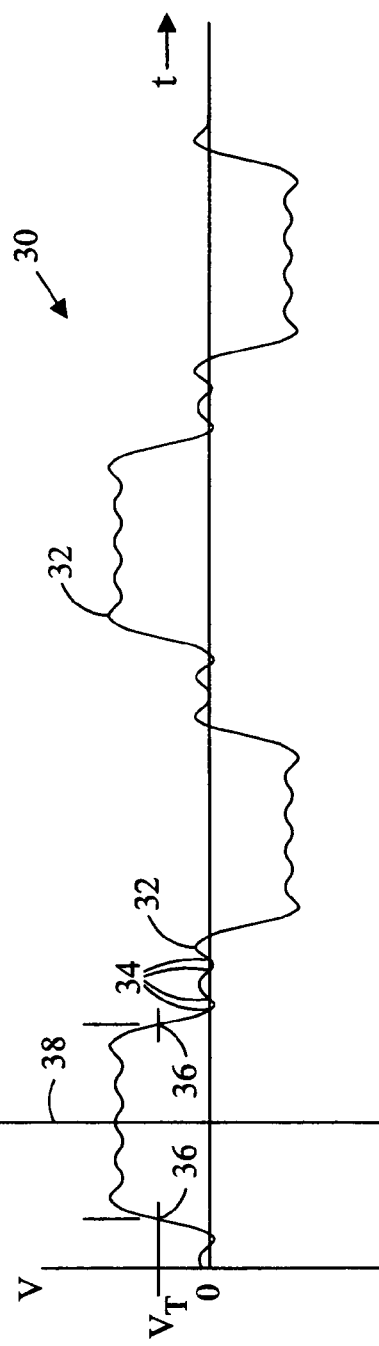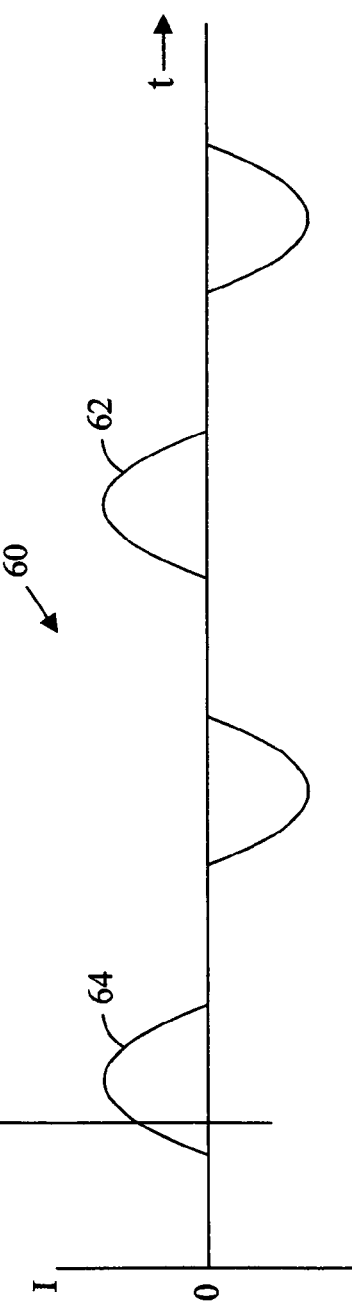

METHOD AND APPARATUS FOR PHASE DETERMINATION

CROSS-REFERENCE TO RELATED APPLICATIONS

This application claims the benefit of U.S. patent application Ser. No. 60/613,752 filed Sep. 27, 2004.

STATEMENT REGARDING FEDERALLY SPONSORED RESEARCH OR DEVELOPMENT

Not applicable.

BACKGROUND OF THE INVENTION

The present invention relates to a method and apparatus for determining the relative phase of two waveforms and, more particularly, to an electricity metering method and apparatus for determining the phase of distorted voltage and current waveforms.

Electric power is typically generated at a remote, central generating facility and transported to the consumer over a distribution system. To reduce power transportation losses, a step-up, subtransmission transformer is used to increase the voltage and reduce the current for transmission over a transmission line. The actual transmission line voltage usually depends on the distance between the subtransmission transformers and the consumers of the electricity but is commonly in the range of 2–35 kilo-volts ("kV"). Distribution substation transformers and distribution transformers of an electric utility's secondary power distribution system reduce the voltage from the transmission line level to a distribution voltage for delivery and use by industrial, commercial, and residential customers. In the United States, for example, electric power is typically delivered to the consumer as a alternating current (AC) voltage ranging from 120 volts ("V") to 660 V, depending upon the use. As generated, the fundamental AC voltage and current approximate 60 Hertz ("Hz") sine waves over time.

The consumption of power by individual consumers and the performance of the distribution system are monitored by power meters. Power meters are used to monitor a number of electrical parameters related to power distribution and use, including the active power, the time rate of transferring or transforming energy, and the apparent power, the product of the root mean square (RMS) voltage and current. In addition, the reactive power, the product of the RMS voltage and the quadrature component of the current, and the power factor or quality factor, the ratio of active power to apparent power, are commonly monitored.

Power meters may also be used to measure the phase angle between the current and voltage waveforms. The phase angle expresses the temporal relationship of a cycle distinguishing feature of a first waveform, commonly an amplitude peak or a zero crossing, to the position of a corresponding feature in another waveform. As generated, the voltage and current waveforms are in phase and simultaneously reach zero, maximum, and minimum amplitudes. If the load is purely resistive, the voltage and current remain in phase. However, if the load is capacitive, the phase distinguishing feature of the current waveform will precede that of the voltage waveform and the phase angle is designated as leading. On the other hand, an inductive load produces a lagging phase angle with the phase distinguishing feature of the voltage waveform preceding that of the current waveform. The reactive power consumed by capacitive and inductive loads causes power losses in the transmission system and reduces the overall efficiency of the power distribution system. Phase angle measurement permits billing the consumer for reactive power losses and analysis of the nature of the load so that power conditioning equipment can be added to the system to reduce the reactive power losses.

Inductive, capacitive, and resistive loads have impedances that are independent of voltage and at any single frequency the impedances of these loads are linear. While an inductive or capacitive load will cause the relative phase angle of the voltage and current to change, the sinusoidal voltage and current waveforms are not distorted when an AC voltage is applied to an inductive, capacitive, or resistive load. Sinusoidal waveforms have definite zero crossings and amplitude peaks and, typically, either a zero crossing or an amplitude peak is selected as the distinguishing feature to temporally mark the cycles of a waveform when determining the phase angle or phase.

Referring to FIG. 1C, on the other hand, power electronic loads; including variable speed drives, rectifiers, inverters, and arc furnaces; draw current 60 in short abrupt pulses 62 rather than in a smooth sinusoidal manner and are characterized as non-linear. When a non-linear load is connected to a sinusoidal voltage, the current flow is not proportional to the instantaneous voltage and is not sinusoidal. The non-linearity of power electronic loads produce harmonics of the fundamental voltage sine wave. In a power distribution system, the expected frequency of the voltage or current, e.g., 50 Hz, 60 Hz, or 400 Hz, is conventionally referred to as the "fundamental" frequency, regardless of the actual spectral amplitude peak. Integer multiples of this fundamental frequency are usually referred to as harmonic frequencies or harmonics. Referring to FIGS. 1A and 1B, when a sine wave of the fundamental frequency 20 is combined with a plurality of harmonics 22, 24, 26, 28 the instantaneous amplitude of the resulting waveform 30 is a sum incorporating the instantaneous amplitude of the fundamental waveform and the corresponding instantaneous amplitudes of the harmonic waveforms. Determining the phase of a waveform relative to an amplitude peak or a zero crossing of a harmonically distorted waveform 30 is problematic because the contributions of higher frequency harmonics commonly produces a plurality of contemporaneous amplitude peaks 32, particularly in the vicinities of the expected amplitude peaks or zero crossings of the fundamental waveform. As a result of the dithering of the amplitude, the distorted wave commonly includes a plurality of contemporaneous zero crossings 34 and amplitude peaks 32. Extensive filtering to remove harmonic frequencies from the reference waveform or other computationally intensive signal processing, such as interpolation, is required to consistently distinguish a zero crossing or amplitude peak for a succession of cycles of a harmonically distorted waveform.

What is desired, therefore, is a method and apparatus for accurate and consistent determination of the phase angle relative to a harmonically distorted waveform.

BRIEF DESCRIPTION OF THE DRAWINGS

FIG. 1A illustrates a plot of a sine wave having a fundamental frequency and plots of the fifth, seven, eleventh and thirteenth harmonics of the fundamental sine wave.

FIG. 1B is an illustrative plot of a harmonically distorted voltage waveform comprising a combination of the fundamental frequency and the fifth, seven, eleventh, and thirteenth harmonics as illustrated in FIG. 1A.

FIG. 1C is an illustrative plot of an input current to a power electronic load.

DETAILED DESCRIPTION OF THE INVENTION

Figure 2:
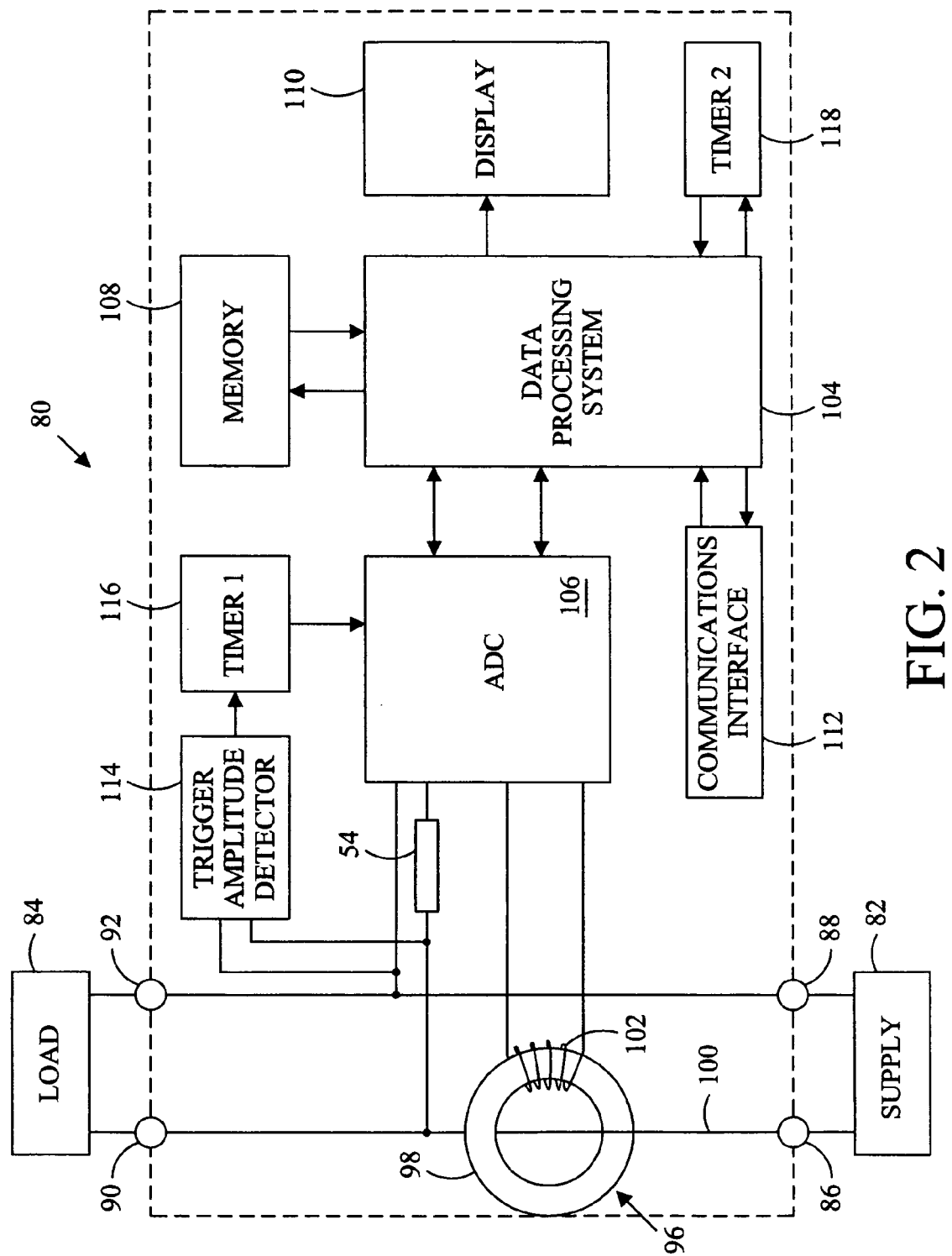
FIG. 2 is a schematic representation of an electric power meter.

Referring in detail to the drawings where similar parts of the invention are identified by like reference numerals, and, more particularly, to FIG. 1A electric power is commonly generated and delivered to a consumer as an alternating current (AC) voltage. An AC waveform is a periodic waveform comprising a plurality of substantially similar cycles that approximates a sine wave with time. As generated and delivered to the electrical distribution system, the AC voltage and current sine waves are expected to have a particular frequency known as the fundamental frequency. In the United States, the fundamental frequency is typically 60 Hz.

The sinusoidal AC voltage and current waveforms are defined, respectively, by the equations:

$$v = V_m \cos(\omega t + \theta_v) \qquad (1)$$

$$i = I_m \cos(\omega t + \theta_i) \qquad (2)$$

where: v=instantaneous voltage
$V_m$=maximum voltage of the fundamental waveform
i=instantaneous current
$I_m$=maximum current of the fundamental waveform
$\omega$=angular frequency of the sinusoidal function
$\theta_v$=phase angle of the sinusoidal voltage
$\theta_i$=phase angle of the sinusoidal current The voltage and current phase angles ($\theta_v$, $\theta_i$) express the amplitude of the respective waveform at the time that a measurement is initiated (t=0). Since the position of the time axis is arbitrary, either the voltage phase angle ($\theta_v$) or the current phase angle ($\theta_i$) is commonly assumed to be zero and the phase angle or phase ($\theta$) expresses the relative angular relationship, and, therefore, the relative temporal relationship of a distinguishing feature of two periodic waveforms, as indicated by the following:

$$v = V_m \cos(\omega t) \qquad (3)$$

$$i = I_m \cos(\omega t + \theta) \qquad (4)$$

As generated, the voltage and current are "in phase" ($\theta=0$) and the zero amplitude crossings and amplitude peaks of the AC waveforms occur simultaneously.

Referring to FIG. 2, electrical power consumed by a user is typically monitored by an electrical power meter 80 adapted for connection between a supply 82 and a load (or loads) 84 of an electrical distribution system via input terminals 86, 88 and output terminals 90, 92. The supply voltage is sensed through a voltage transducer 94, such a voltage divider resistor, and the load current is sensed by a current transducer 96, commonly a current transformer. A current transformer typically comprises a toroidal core 98 with conductive wire wrapped around the cross-section of the core to form a secondary winding 102. A conductor 100 connecting the supply terminal 86 to the load terminal 90 and passing through the aperture in the center of the toroidal core 98 comprises the primary winding of the current transformer 96. The primary winding has $N_1$ turns (commonly, $N_1$=1) and the secondary winding has $N_2$ turns and, thus, the current transformer 96 has a turns ratio (n) of $N_1/N_2$. Current passing through primary winding induces a voltage in the secondary winding from which the amplitude of the primary current can be determined.

The outputs from the exemplary current transducer 96 and the exemplary voltage transducer 94 are input to a data processing system 104 through an analog-to-digital converter (ADC) 106. The data processing system 104 comprises a data processing device, typically, a microprocessor, programmable logic device (PLC), or digital signal processor, program instructions, and related data storage and peripheral devices. The data processing system 104 includes a memory 108 that is adapted to store instructions and data used by the data processing device in calculating the current, voltage, power, and other related electrical parameters (e.g., number of turns in the secondary winding, etc.). The data processing system 104 is also connected to a display system 110 permitting display of the metered quantities. A user interface may be incorporated in the display section permitting manual selection of different metered quantities for display. Other peripheral devices, components, and features may be provided including, for example, a communications interface 112 that enables remote reporting of the meter results or transmission of instrument data to a remote data processing system.

Digital, electronic power metering equipment typically calculates the power and other electrical parameters from a plurality instantaneous voltage and current amplitudes obtained by independently sampling the outputs of the voltage and current transducers. The outputs of the voltage and current transducers vary, respectively, with the variation of the voltage and current at the meter's terminals. Typically, sampling is controlled by the meter's data processing system so that it is performed periodically and at known times in relation to the sinusoidal fundamental waveform.

The relative phase or phase angle of a pair of periodic waves is determined by resolving the temporal difference in the occurrence of corresponding cyclic distinguishing features of the cycles of the two waveforms. As generated, the AC voltage and current waveforms are "in phase," sine waves that simultaneously attain zero, maximum, and minimum amplitudes. If the load is purely resistive, the voltage and current remain in phase ($\theta=0$). However, inductance or capacitance causes a temporal shifting of the sinusoidal current and voltage waveforms so that the peak and zero amplitudes of the waveforms no longer occur simultaneously ($\theta \neq 0$). While inductance and capacitance cause a phase shift, a change in the phase angle, the impedance of resistive, capacitive, and inductive loads is linear and the sinusoidal current and voltage waveforms are not distorted by the load. Since a sine wave exhibits discrete zero crossings and amplitude peaks, a zero crossing or amplitude peak of one of the waveforms, a reference waveform, is commonly used to temporally distinguish the cycles of the reference waveform so that the interval and, consequently, the phase angle to a corresponding zero crossing or amplitude peak of the other waveform can be measured.

Increasingly, however, the loads imposed on electrical distribution systems comprise power electronic loads, including AC and DC variable speed drives, power rectifiers and inverters, arc furnaces, and discharge lighting, such as fluorescent lighting. Typically, power electronic loads include a front end section comprising a rectification bridge and a parallel input filter capacitor. The front end section acts as a peak detector because current flows to charge the capacitor only during a portion of each half cycle of the sine wave when the instantaneous AC voltage exceeds the voltage on the capacitor. Between these current peaks, the load draws energy stored in the capacitor.

Referring to FIG. 1C, power electronic loads draw current 60 in short abrupt pulses 62 rather than in a smooth sinusoidal manner and are characterized as non-linear. The current flow to a non-linear load is not proportional to the instantaneous voltage and is not sinusoidal. Referring to FIG. 1A, when connected to a sinusoidal voltage, non-linear power electronic loads produce harmonics of the fundamental voltage sine wave. The expected frequency of the voltage or current is conventionally referred to as the "fundamental" frequency, regardless of the actual spectral peak and integer multiples of this fundamental frequency are usually referred to as harmonic frequencies or harmonics.

The specific harmonics produced by a power electronic load are determined by the number of rectifiers (pulse number) used in the rectification circuit and can determined by the equation:

$$h = (n \times p) \pm 1 \qquad (5)$$

where: n=an integer (1, 2, 3 . . . )
p=number of pulses or rectifiers

For example, a typical six-pulse rectifier commonly used in a 3-phase, 60 Hz circuit produces odd harmonics, including fifth and seventh harmonics (h=(1×6)±1) (300 Hz and 420 Hz); eleventh and thirteenth harmonics (660 Hz and 780 Hz); seventeenth and nineteenth harmonics (1020 Hz and 1140 Hz), and twenty-third and twenty-fifth harmonics (1380 Hz and 1500 Hz). When a fundamental waveform is combined with its harmonics, the instantaneous amplitude of the resulting waveform comprises a sum incorporating the instantaneous amplitudes of the fundamental wave and each of the harmonic waves. Referring to FIGS. 1A and 1B, a fundamental sine wave 20 is significantly distorted 30 when combined with its fifth 22, seventh 24, eleventh 26, and thirteenth 28 harmonics. In addition, the harmonic distortion produces a succession of localized amplitude peaks 32, particularly in the vicinities of the expected zero crossings and amplitude peaks of the fundamental waveform and, as a result, the harmonically distorted waveform 30 typically includes a plurality contemporaneous zero crossings and amplitude peaks. If a zero crossing or peak amplitude is used to temporally distinguish the cycles of a harmonically distorted reference waveform, such as, the distorted voltage waveform 30, either filtering to remove the harmonic components or computationally intensive interpolation is required to consistently temporally mark the amplitude that distinguishes the cycles of the waveform.

The present inventor concluded that extensive filtering would not be required and the data processing resources of a power meter could be substantially reduced if, for phase measurement, the cycles of a waveform were temporally distinguished at a trigger amplitude that is greater than zero but less than a peak amplitude of the waveform. The amplitudes of the harmonics 22, 24, 26, 28 are substantially less than the amplitude of the fundamental waveform and are not arithmetically summed but combined by root mean square (RMS) summation, as follows, to determine the instantaneous amplitude of the harmonically distorted resultant waveform:

$$V_{rms} = (V_1^2 + V_2^2 + V_3^2 + \ldots + V_n^2)^{1/2} \qquad (6)$$

where: $V_{rms}$=the rms voltage
$V_n$=the rms voltage of the nth harmonic

The present inventor realized that the local amplitude peaks 32 are typically less than ten percent of the peak amplitude of the fundamental waveform and a trigger amplitude greater than 10% of the peak amplitude of the fundamental waveform and less than 90% of the peak amplitude of the fundamental waveform substantially avoids the amplitude dithering that occurs in the vicinities of the expected zero crossings and amplitude peaks of the fundamental waveform. In addition, a trigger amplitude substantially intermediate to zero amplitude and the peak amplitude, for example, 50 V. for a 120 V. system, provides the greatest resistance to false triggering from harmonic distortion and is the least affected, temporally, by the harmonic distortion. Further, the inventor realized that, as result of rms summation, the maximum amplitude of a harmonically distorted waveform is approximately equal to the maximum amplitude of the fundamental frequency and a trigger amplitude based on the maximum amplitude of the fundamental frequency has substantially the same immunity to false triggering as trigger amplitude based on the maximum amplitude of the distorted waveform.

Figure 4:
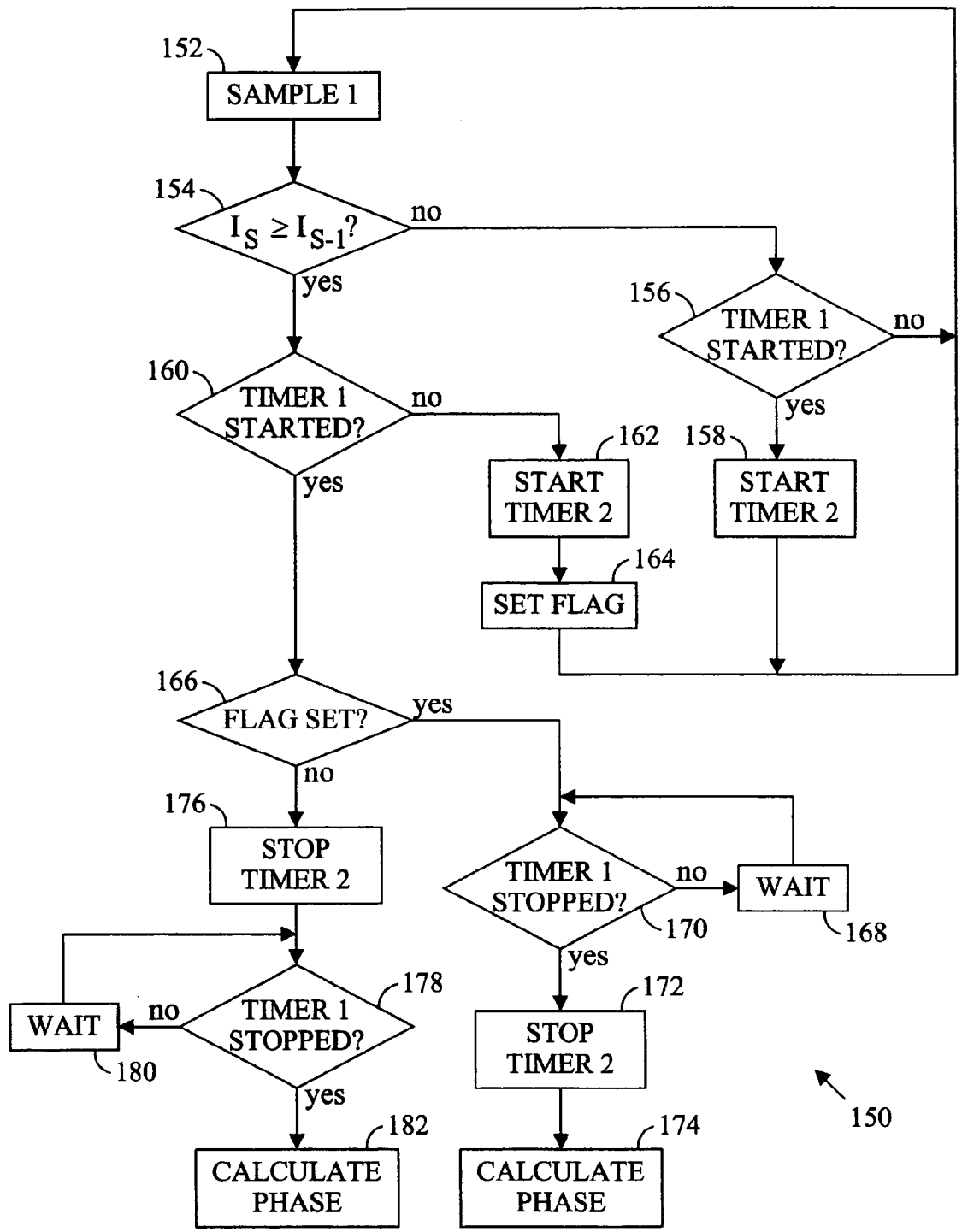
FIG. 4 is a flow diagram of a method for determining the phase angle of two periodic waveforms.

The relative phase or phase angle of two periodic waveforms of known frequency is proportional to the time interval elapsing between the occurrences of amplitudes that distinguish the repetition of cycles of the waveforms. Referring to FIG. 4, in the phase angle measurement method 150 used in the power meter 80, the phase angle between a first waveform, for example, the input current 60 to a power electronic load, and a harmonically distorted reference waveform, for example, the harmonically distorted voltage 30 is determined by timing an interval between occurrences of temporally distinguishing amplitudes of the two waveforms. The cyclic pulses of the first waveform, the current, are conveniently temporally marked at the peak 64 of the amplitude pulse.

On the other hand, occurrences of an amplitude equaling a trigger amplitude are used to distinguish cycles of the harmonically distorted reference waveform, the voltage 30. Even though the waveform is harmonically distorted, the cycles of the periodic wave are substantially symmetrical about the expected maximum amplitude of the fundamental frequency 38 which occurs at substantially one-half of the interval between the occurrences of the trigger amplitudes 36 on the increasing and decreasing slopes of the cycle. In addition, the harmonically distorted waveform is symmetrical about zero amplitude and the cycles can be temporally distinguished by occurrences of amplitudes having absolute values equal to the absolute value (either positive or negative amplitudes) of the trigger amplitude. To avoid false triggering resulting from the localized amplitude dithering, particularly in the vicinity of the expected zero crossing and amplitude peak of the fundamental frequency component of the harmonically distorted reference waveform, the trigger amplitude is set at a level greater than 10% but less than 90% of the maximum amplitude of the fundamental frequency component of the waveform. Typically, an amplitude approximately intermediate between zero and the maximum amplitude of the fundamental frequency, for example 50V, is selected as a trigger amplitude because the resistance to false triggering is greatest and the temporal effects of harmonic distortion are minimized at one-half of the maximum amplitude.

Figure 3:
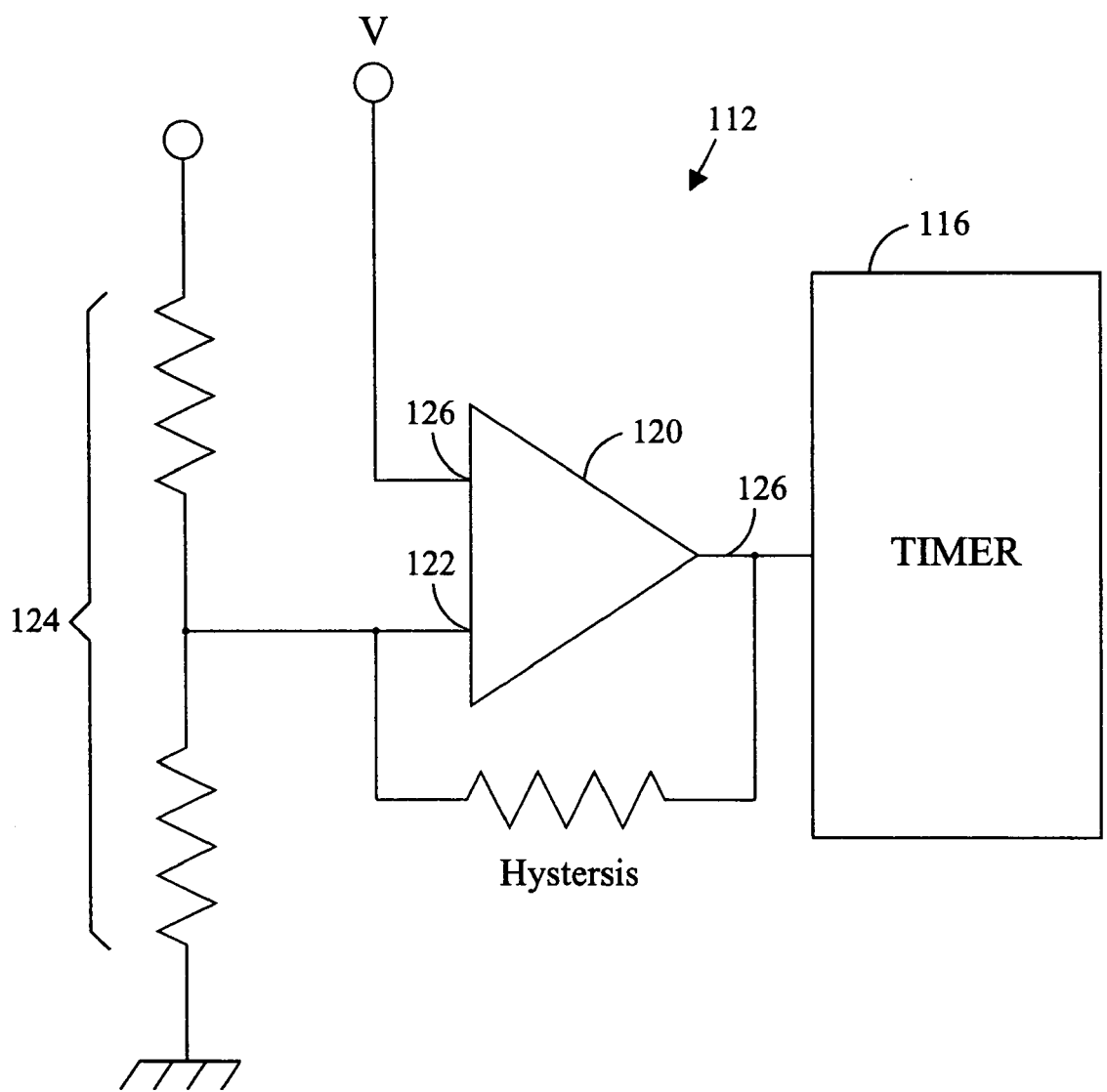
FIG. 3 is a schematic representation of a trigger amplitude detector of the electric power meter of FIG. 2.

In the power meter 80, occurrences of a voltage equal to the trigger voltage 36 are detected by a trigger amplitude detector 114. The trigger amplitude detector 114 initiates operation of a first timer 116 when the absolute value of the instantaneous voltage 30 equals or exceeds the absolute value of the trigger voltage 36 on one edge of the cycle and terminates operation of the first timer when the absolute value of the voltage again drops below the absolute value of the trigger voltage on the opposite edge of the cycle. Referring to FIG. 3, the trigger amplitude detector 114 comprises an operational amplifier 120 having a first input 122 connected to a voltage divider 124 (indicated by a bracket) that is the source of a reference voltage equal to the desired trigger voltage. The second input 126 of the operational amplifier is connected to the supply voltage. The trigger amplitude detector 114 comprises, generally, a comparator having an output 126 connected to the first timer 116. When the supply voltage increases to a level equaling the selected trigger voltage 36 the output of the trigger amplitude detector 114 signals the timer 116 to initiate timing of a first interval. When the voltage 30 decreases to less than the trigger voltage 36, operation of the first timer 116 terminates. The operation of the first timer 116 is also signaled to the meter's data processing system 104 through the ADC 106. While the supply voltage amplitude sampling used in determining the power could used in temporally distinguishing the cycles of the distorted voltage waveform, the trigger amplitude detector provides additional accuracy without requiring additional data processing resources to interpolate amplitude samples to determine when the voltage equals the trigger voltage. In addition, to reduce the likelihood that the sensed signal oscillates above and below the sample level, some hysteresis may be included in the amplification, such as with a feedback resistor 207, to reduce the effects of the harmonics and noise in the signal.

Referring to FIG. 2, in the power meter 80, the phase angle is determined from the temporal relationship of the peak current 64 and the peak voltage as inferred from the occurrences of instantaneous voltages 30 equal to the trigger voltage 36 on the rising and falling edges of the harmonically distorted voltage cycle. To determine the power flow to the load 84, the data processing system 104 periodically samples the voltage and current 152 from the output of the respective voltage 54 and current 96 transducers. If the amplitude of the current of the present sample ($I_s$) does not exceed the current of the previous sample ($I_{s-1}$) 154, the data processing system determines if the first timer 116 has been started by the trigger amplitude detector 114 to measure the first interval, at step 156. If the first timer 116 has not been started, the voltage has not reached the trigger voltage and the data processing system samples the current again 152 at the appropriate time. If the peak current 64 has not been reached 154, but the first timer has been started 156, operation of a second timer 118 is initiated by the data processing system 158 to measure a second interval.

If the peak current has been reached 154, the operating status of the first timer is also checked 160. If the first timer has not been started, timing is initiated with second timer 162 and a flag is set 164 indicating that the peak amplitude of the current was attained before the voltage 30 had reached the trigger amplitude 36.

If the current has attained its maximum amplitude 154 at the present sample and the first timer has been started 160, the data processing system checks the status of the flag 166. If the flag has been set 166, indicating that operation of the second timer was initiated before operation of the first timer was initiated; the data processing system waits 168 until the trigger amplitude detector 114 terminates operation of the first timer 170 and then terminates operation of the second timer 172. The data processing system 104 then calculates the phase angle from the first and second time intervals 174.

Since the second timer was initiated before the voltage reached the trigger voltage 36, the phase is leading and the phase angle equals:

$$\theta = \omega\left(\Delta T_2 - \frac{\Delta T_1}{2}\right) \tag{7}$$

where: ω=the angular frequency
ΔT$_2$=second timer interval
ΔT$_1$=first timer interval On the other hand, if, when sampled 152, the current has attained its maximum amplitude 154 and the first timer has been started 160, but the flag 166 indicates that the operation of the second timer was initiated when the voltage reached the trigger voltage 36 and operation of the first timer was initiated; the second timer is stopped 176. The data processing system waits 180 until the trigger amplitude detector 114 stops the first timer 178 and then calculates the phase 182 from the first and second time intervals. In this case, the phase angle equals:

$$\theta = \omega\left(\frac{\Delta T_1}{2} - \Delta T_2\right) \tag{8}$$

If the second time interval is less than one-half the first time interval, the calculated phase will be positive, indicating a leading phase produced by a capacitive load. If the second timer interval is greater than one-half of the first timer interval, the phase angle will be negative indicating an inductive load.

While the first 116 and second 118 timers are illustrated as discrete devices, the timers can be integral to the data processing system 104. In addition, at least one of the first timer 116 and the second timer 118 could be implanted as a sample counter because the voltage and current sampling are typically performed synchronously by the data processing system 104 permitting the time intervals to be calculated from sample counts.

The phase determination apparatus and method used in the electric power meter provides an accurate and computationally uncomplicated system for determining the phase angle of a first waveform relative to a harmonically distorted reference waveform.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

The invention claimed is:

1. A power meter comprising:
(a) a trigger amplitude detector sensing a supply voltage, said trigger amplitude detector outputting a signal to initiate measurement of a first interval when an amplitude of said supply voltage exceeds a trigger amplitude and outputting another signal to terminate measurement of said first interval when said amplitude of said supply voltage no longer exceeds said trigger voltage; and
(b) a data processing system arranged to periodically sample a load current and including an instruction to:
   (i) compare an amplitude of a present load current sample to an amplitude of a previous load current sample;
   (ii) initiate measurement of a second interval upon the earlier occurrence of:
      (a) initiation of said measurement of said first interval; and
      (b) said amplitude of said present load current sample not exceeding said amplitude of said previous load current sample;
   (iii) terminating measurement of said second interval upon the later occurrence of:
      (a) said amplitude of said first load current sample not exceeding said amplitude of said previous load current sample; and
      (b) termination of said measurement of said first interval; and
      (c) calculating a relative phase angle of said supply voltage and said load current from said first and said second intervals.

2. The power meter of claim 1 wherein said trigger amplitude comprises an amplitude greater than twenty percent of a maximum amplitude of said supply voltage and less than eighty percent of said maximum amplitude of said supply voltage.

3. The power meter of claim 1 wherein said trigger amplitude comprises an amplitude greater than thirty percent of a maximum amplitude of said supply voltage and less than seventy percent of said maximum amplitude of said supply voltage.

4. The power meter of claim 1 wherein said trigger amplitude comprises an amplitude greater than forty percent of a maximum amplitude of said supply voltage and less than sixty percent of said maximum amplitude of said supply voltage.

5. The power meter of claim 1 wherein said trigger amplitude detector comprises a voltage comparator arranged to compare an instantaneous amplitude of said supply voltage to a trigger voltage.

6. The power meter of claim 1 wherein said trigger amplitude detector comprises a operational amplifier having a first input connected to a supply voltage and a second input connected to a source of a reference voltage, said reference voltage equaling said trigger voltage.

7. The power meter of claim 1 further comprising a timer responsive to said signal from said trigger amplitude detector to initiate and terminate measurement of said first interval.

8. The power meter of claim 1 further comprising a sample counter timer responsive to said signal from said trigger amplitude detector to initiate and terminate measurement of said first interval.

9. The power meter of claim 1 further comprising a sample counter responsive to said signal from said trigger amplitude detector to initiate and terminate measurement of said first interval.

10. The power meter of claim 1 further comprising a sample counter responsive to said data processing system to initiate and terminate measurement of said second interval.

* * * * *